United States Patent
Moore et al.

(10) Patent No.: US 7,080,292 B2
(45) Date of Patent: *Jul. 18, 2006

(54) METHOD FOR TESTING JITTER TOLERANCE OF HIGH SPEED RECEIVERS

(76) Inventors: Charles E. Moore, 425 W. 10th St., Loveland, CO (US) 80537; Aaron M. Volz, 7139 Egyptian Dr., Fort Collins, CO (US) 80525; Suzette D. Vandivier, 2807 Whitworth Dr., Fort Collins, CO (US) 80525; Jason T. Nguyen, 532 Kim Dr., Fort Collins, CO (US) 80525

( * ) Notice: Subject to any disclaimer, the term of this patent is extended or adjusted under 35 U.S.C. 154(b) by 384 days.

This patent is subject to a terminal disclaimer.

(21) Appl. No.: 10/409,949

(22) Filed: Apr. 9, 2003

(65) Prior Publication Data

US 2004/0205431 A1   Oct. 14, 2004

(51) Int. Cl.
*G11B 5/00* (2006.01)
*G06F 11/00* (2006.01)

(52) U.S. Cl. ...................... 714/700; 724/817

(58) Field of Classification Search ............ 714/700, 714/811, 815, 817, 707, 704, 738, 744, 724; 713/500, 503, 400, 401

See application file for complete search history.

(56) References Cited

U.S. PATENT DOCUMENTS

| 5,463,639 | A | * | 10/1995 | Koishi et al. | ............... 714/740 |
| 5,835,501 | A | * | 11/1998 | Dalmia et al. | ............... 714/704 |
| 6,374,388 | B1 | * | 4/2002 | Hinch | ........................ 714/799 |
| 2003/0041294 | A1 | * | 2/2003 | Moll et al. | ................... 714/709 |

* cited by examiner

*Primary Examiner*—Christine T. Tu (57) ABSTRACT

A method and apparatus is presented for measuring jitter tolerance in a device under test. A device under test is established to operate at a specific frequency. A bit pattern is generated from a bit pattern generator. The bit pattern generated by the bit pattern generator is produced at a frequency that is a multiple of the frequency that the device under test is operating under. Bits are systematically changed in the bit pattern and then errors are measured in the device under test. As a results the jitter tolerance of the device under test is measured.

20 Claims, 8 Drawing Sheets

METHOD FOR TESTING JITTER TOLERANCE OF HIGH SPEED RECEIVERS

CROSS REFERENCE TO RELATED APPLICATIONS

This application is related to application Ser. No. 10/228,909 filed Aug. 27, 2002 and entitled A Method and Apparatus For Testing A High Speed Data Receiver For Jitter Tolerance.

BACKGROUND OF THE INVENTION

Description of the Related Art

Communication systems include a transmitter communicating information and a receiver receiving information. In digital communication systems, the transmitter communicates a pattern of zeros and ones to the receiver. The zeros and ones are used to represent the communicated information. Both the transmitter and receiver synchronize so that the receiver can distinguish between a logical zero and a logical one.

When high-speed digital data is transmitted over a communication channel with limited bandwidth, the digital data may be degraded. One form of degradation results from the transition between digital states (e.g., zeros and ones). The transitions may be delayed by different amounts depending on surrounding data and other effects. This variation in delay of transitions is known as jitter. The variation (e.g., delay) moves the signal forward or backward. In other words, the signal (e.g., zero or one) may occur before the receiver is scheduled to sample the transition or the delay may occur after the receiver starts to sample the transition. If the receiver samples data at discrete times and jitter delay moves the transition between digital states at a time that is different from the time expected by the receiver, the wrong data may be sampled. Improperly sampling or interpreting data in the receiver will result in an error. When the error is caused by jitter, the error is known as a jitter error.

The ability of a receiver to sample data correctly in the presence of jitter is known as jitter tolerance. The jitter tolerance is typically quantified as the peak-to-peak jitter, which is present without causing an unacceptable error rate. Measuring jitter tolerance of receivers is an important operation in the manufacture of high-speed receivers. Applying a representative signal with a known amount of jitter to a receiver and measuring the error rate is a conventional technique used to measure jitter tolerance.

As clock speeds in computers and data rates in communication systems increase, timing budgets become tighter and the need to measure and characterize jitter becomes more critical. On some networks, devices, such as jitter generators, may be used to generate a known amount of jitter. The jitter generator introduces jitter in a communication connection. Using these generators the jitter tolerance of the communication link (transmitter, receiver) may be determined before deploying the transmitter and receiver to the field or prior to implementing production of the transmitter or receiver.

A number of conventional techniques have been used to measure jitter tolerance. In one method, a test signal is generated by clocking data with a frequency-modulated clock. The clock signal is shifted to introduce errors into the signal. The signal is measured in the receiver to determine the amount of error. However, a disadvantage in this approach is the availability of clocks, which can be modulated to a large jitter, at high data rates. In addition, the modulation is symmetrica; therefore, the test cannot independently measure sensitivity to early and late transitions.

In a second conventional technique, a test signal is filtered in a calibrated filter (e.g., low-pass filter) and, optionally, the filtered signal is passed through a limiting amplifier to prevent interactions with any peaking or roll off in the receiver. However, in this approach, calibration is necessary and can be difficult; it is hard to adjust the amount of jitter; and the modulation is symmetrical; therefore, the test signal cannot independently measure sensitivity to early and late transitions.

In a third approach, noise is added to a test signal with slow rise and fall times and optionally a signal is passed through a limiting amplifier. However, in this approach, calibration is necessary and can be difficult to perform; the results of this approach is statistical in nature and, therefore, is hard to reproduce; and the modulation is symmetrical, therefore, it is difficult to measure sensitivity to early and late transitions.

Thus, there is a need in the art for a method and apparatus that measures jitter tolerance. There is a need in the art for a method and apparatus that measures jitter tolerance in high bandwidth communication links. There is a need in the art for a method and apparatus of measuring jitter tolerance that is flexible and enables the operator to easily measure a range of jitter tolerances. There is a need in the art for a method and apparatus of measuring jitter tolerance that is easily reproducible.

SUMMARY OF THE INVENTION

In one embodiment of the present invention, a method of testing jitter comprises the steps of generating a first bit pattern, wherein the first bit pattern is generated at a multiple of a communication speed of a receiver; generating a second bit pattern by adjusting the first bit pattern; communicating the second test pattern; generating a third bit pattern by receiving bits in the receiver in response to communicating the second bit pattern; and testing the third bit pattern for jitter. In the method, the step of generating the second bit pattern includes adjusting the first bit pattern by removing at least one bit from the first bit pattern. The step of generating the second bit pattern includes adjusting the first bit pattern by changing at least one bit in the first bit pattern. The step of testing the bit third bit pattern for jitter includes testing the third bit pattern in the receiver. The step of testing the third bit pattern for jitter includes comparing the second bit pattern with the third bit pattern.

In another embodiment, a method of testing jitter comprises the steps of receiving a third bit pattern in a receiver, the third bit pattern produced by generating a first bit pattern which is a multiple of a communications speed of the receiver, changing at least one bit in the first bit pattern thereby producing a second bit pattern and receiving the second bit pattern in the receiver thereby producing the third bit pattern; and testing the third bit pattern for jitter by comparing the second bit pattern to the third bit pattern.

In a third embodiment, a method of testing jitter comprises the steps of (a) generating a bit pattern wherein the bit pattern is a multiple of an operating frequency of a receiver; (b) generating a test pattern by changing at least one bit in the bit pattern; (c) generating a received test pattern by receiving bits in the receiver in response to communicating the test pattern; (d) determining jitter by testing whether the test pattern matches the received test pattern; and (e) perform steps (a) through (e) until jitter is determined as defined in step (d).

A method of testing comprises the steps of generating a test pattern at a non-integer multiple of a data rate expected by a receiver; and testing the receiver for jitter in response to receiving the test pattern generated at the non-integer multiple of the data rate expected by the receiver.

A method of testing comprises the steps of generating a data pattern; testing a receiver with a first test pattern including base jitter, wherein the first test pattern including base jitter is generated in response to the data pattern; and testing the receiver with a second test pattern including induced jitter, wherein the second test pattern including induced jitter is generated in response to the first test pattern.

A method of testing jitter comprises the steps of generating a first bit pattern, wherein the first bit pattern is generated at a multiple of a communication speed of a receiver; generating a second bit pattern by adjusting the first bit pattern; communicating the second bit pattern; generating a third bit pattern by receiving bits in the receiver in response to communicating the second bit pattern; and testing the third bit pattern for jitter.

DETAILED DESCRIPTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

A method and apparatus of performing jitter testing is presented. In one embodiment of the present invention, a bit pattern generator generates a test pattern (e.g., a known sequence of bits). A bit error rate tester (e.g., BERT tester) is connected to a device under test. The device under test is a receiver that receives the generated test pattern. The test pattern is a known test pattern that is generated according to the methodology of the present invention. The BERT tester test the test pattern to determine if there are any errors.

The test pattern is a digital signal, which is represented by digital values (e.g., logical 0 and logical 1). In the method and apparatus of the present invention, the digital signal include transitions (e.g., changes from 0 to 1) which can be individually changed by a known amount. Each transition can be delayed or advanced by a known amount or an integral number of displacement times.

In one embodiment of the present invention, a data pattern generator is presented. The data pattern generator is clocked at a multiple of the data rate of the receiver. For example, if the receiver operates at 1× in the method of the present invention, the data pattern generator may generate data patterns at a rate of 2×, 3×, 4×, etc.

Figure 1:
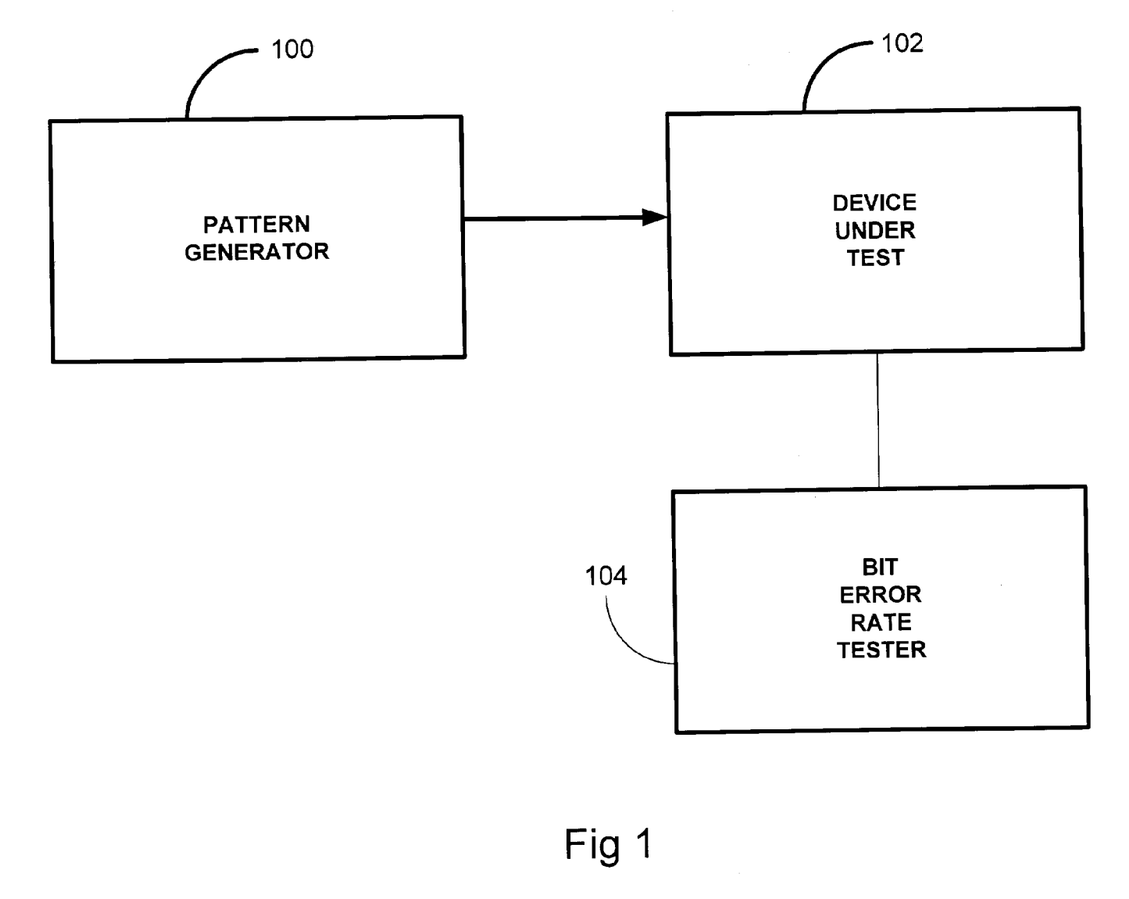
FIG. 1 displays an architecture implementing a method and apparatus of the present invention.

In FIG. 1, an architecture implementing the method and apparatus of the present invention is displayed. In FIG. 1, a pattern generator is shown as 100. The pattern generator 100 has an adjustable frequency. As a result, the pattern generator 100 may adjust frequencies by a predetermined amount. In other words, the pattern generator 100 performs over sampling on a signal and produces a test pattern. The test pattern is transmitted to a receiver. The transmitted test pattern is communicated to a device under test (e.g., DUT) shown as 102. The DUT is a receiver that operates at a fixed frequency or a known frequency for a specific test period. For example, if the DUT 102 operates at 1×, the pattern generator 100 may operate at a multiple of 1×, such as 2×, 3×, 4×, 5×, etc. A BERT tester 104 is connected to the DUT 102. The BERT tester 104 analyzes/measures the test pattern to determine errors in the test pattern.

Figure 2:
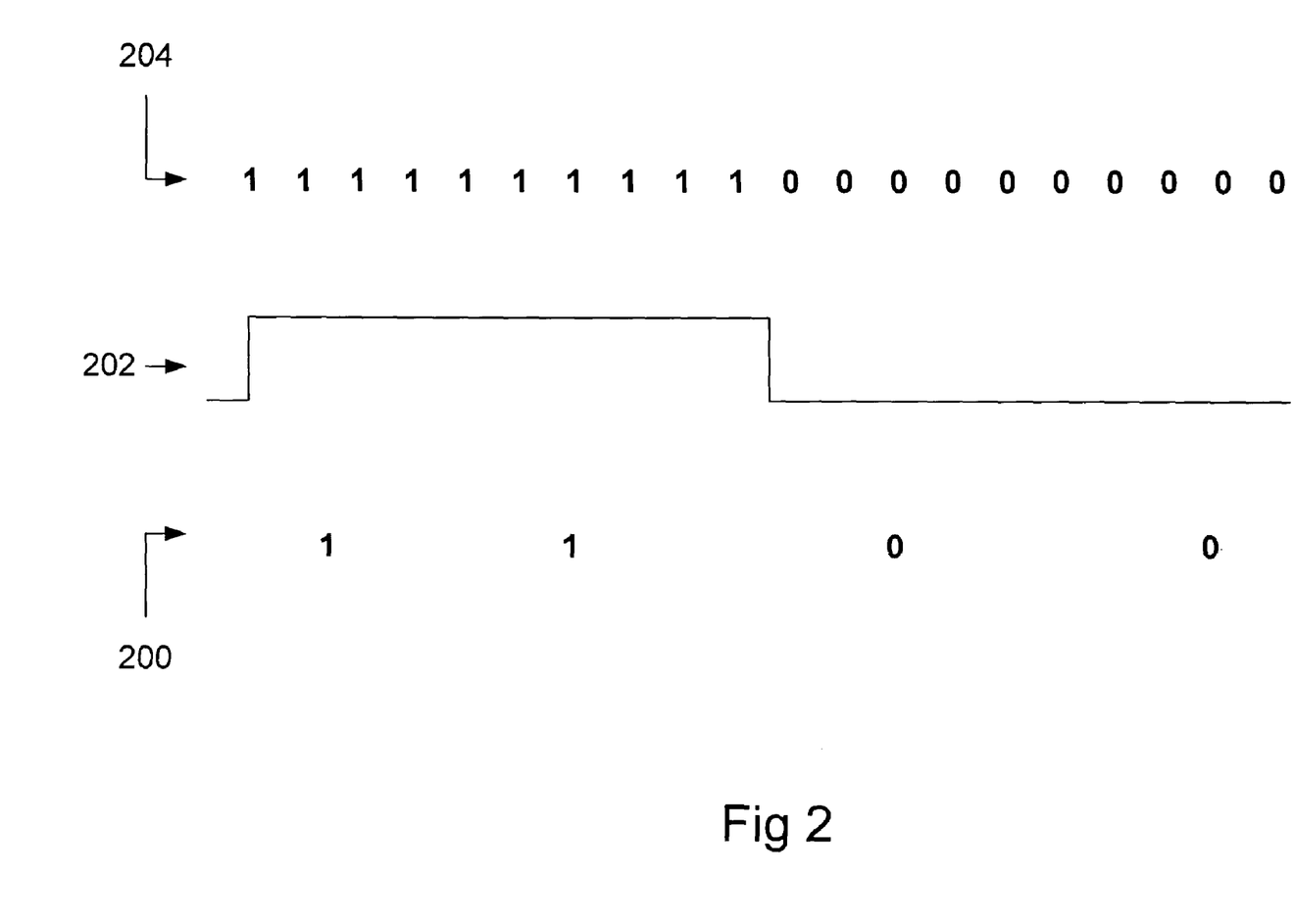
FIG. 2 displays a conceptual drawing of a bit pattern implementing the method and apparatus of the present invention.

FIG. 2 displays a conceptual drawing of a bit pattern implementing the method and apparatus of the present invention. The bit pattern 200 (e.g., 1100) is the bit pattern that is being tested. This is the bit pattern 200 (e.g., 1100) that we will expect the DUT to properly interpret. The bit pattern 200 is represented graphically by the signal shown as 202. In one embodiment of the present invention, 5× over sampling is performed to test the device under test. The bit pattern 204 (e.g., 11111111110000000000) is a bit pattern generated by 5× over sampling. The bit pattern 204 will be generated by the bit pattern generator and transmitted to the DUT. In the case of 5× over sampling, the bit pattern 204 is generated by replicating each bit in the bit pattern 200 five times. Therefore, the first bit in bit pattern 200 (e.g., 1) is replicated five times (e.g., 11111). The second bit in bit pattern 200 (e.g., 1) is replicated five times (e.g., 11111). The third bit in the bit pattern 200 (e.g., 0) is replicated five times (e.g., 00000), and the fifth bit in the bit pattern 200 (e.g., 0) is replicated five times.

Figure 3:
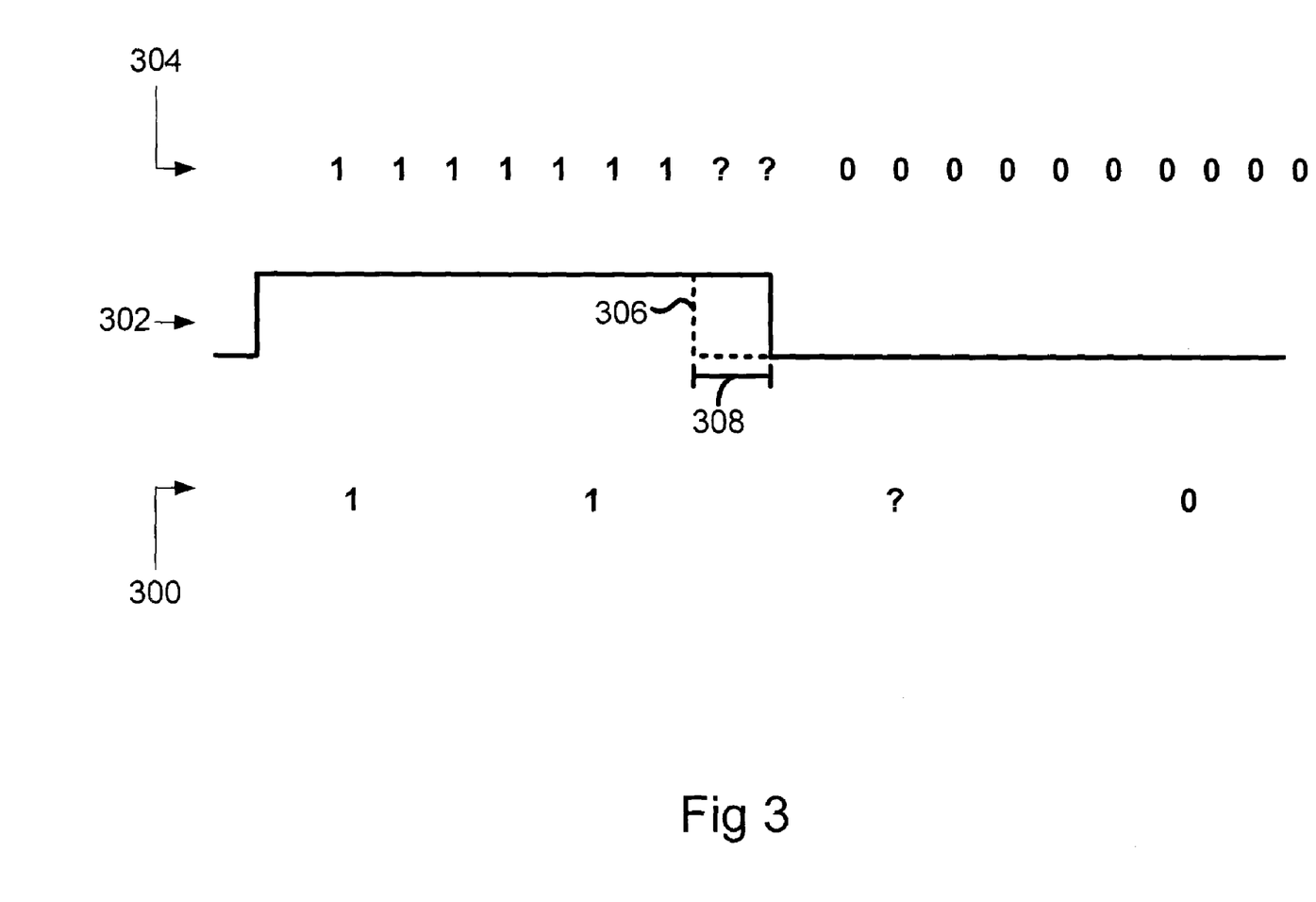
FIG. 3 displays a conceptual drawing of a bit pattern implementing the method and apparatus of the present invention.

FIG. 3 displays a bit pattern 304 generated by the bit pattern generator (e.g., 11111111110000000000). In one method of the present invention, the bits in the bit pattern 304 may be changed to determine the jitter tolerance of the DUT. For example, in bit pattern 304, the bits designated by "?" may be changed. As such, bit pattern 304 "11111111110000000000" may be changed to bit pattern "11111111??0000000000," where the two logical values designated by "??" may be changed. A graphical outline which corresponds to the time interval associated with the two logical values "??" is shown as 306. The time interval associated with the two logical values designated as "??" is shown as 308. In addition to changing the values designated by "??," it should be appreciated that in an alternative embodiment, these values may be removed from the bit pattern to test for jitter.

In response to generating a bit pattern 304, where the two logical values designated by "??" are changed, the bit pattern 300 received by the DUT may also change as represented by "11 ?0," where "?" represents a value that will be measured to determine the jitter tolerance of the DUT. Should the DUT receive the value designated by the "?" in the bit pattern 300 as a logical 0, the DUT is capable of interpreting a signal with 0.4 unit interval of jitter. A graphical depiction of 0.4 unit-interval jitter is shown as 308.

Table I shown below displays the pattern generator frequency and the associated bit pattern that would be transmitted from the receiver to the DUT.

TABLE I

| PATTERN GENERATOR FREQUENCY | BIT PATTERN TRANSMITTED | | | |
|---|---|---|---|---|
| 1X | 1 | 1 | 0 | 0 |
| 2X | 11 | 11 | 00 | 00 |
| 5X | 11111 | 11111 | 00000 | 00000 |

For example, as shown in Table I, if a 1×-bit pattern is 1100, a 2×-bit pattern would be 11110000, and a 5×-bit pattern would be 1111111110000000000, etc. It should be noted that the each bit is replicated a number of times corresponding to the pattern generator frequency.

Table II given below displays the induced jitter for a pattern generator frequency and the resulting bit pattern.

TABLE II

| PATTERN GENERATOR FREQUENCY | INDUCED JITTER | BIT PATTERN TRANSMITTED | | | |
|---|---|---|---|---|---|
| 2X | +0.5 | 11 | 11 | 10 | 00 |
| 2X | −0.5 | 11 | 10 | 00 | 00 |
| 3X | +0.33 | 111 | 111 | 100 | 000 |
| 3X | −0.33 | 111 | 110 | 000 | 000 |
| 5X | +0.2 | 11111 | 11111 | 10000 | 00000 |
| 5X | +0.4 | 11111 | 11111 | 11000 | 00000 |

In Table II, a 1×-bit pattern (not shown) is 1100. Therefore, a 2×-bit pattern is generated as 11110000, a 3×-bit pattern would take the form of 111111000000, and a 5×-bit pattern would take the form of 1111111110000000000. However, in order to test the jitter tolerance, the bit pattern is changed to determine if the DUT will evaluate the bit pattern as 1100. As shown in Table II, at 2×frequency, a bit pattern of 11111000 and 11100000 is sent instead of 11110000 to determine if the DUT can withstand a +0.5 unit interval or −0.5 unit interval induced tolerance, respectively. In order to test +0.33 unit interval or −0.33 unit interval induced tolerance, 3× over sampling is implemented and bit patterns 111111100000 and 111110000000 are transmitted. In order to test +0.2 unit interval and +0.4 unit interval induced tolerance at 5× over sampling, the bit patterns 1111111111000000000 and 1111111111100000000 are transmitted. If the DUT is still able to distinguish the bit pattern as 1100, then the DUT has demonstrated a jitter tolerance at the various levels (e.g., +0,5, −0.5, +0.33, 0.33, +0.2, +0.4).

Figure 4:
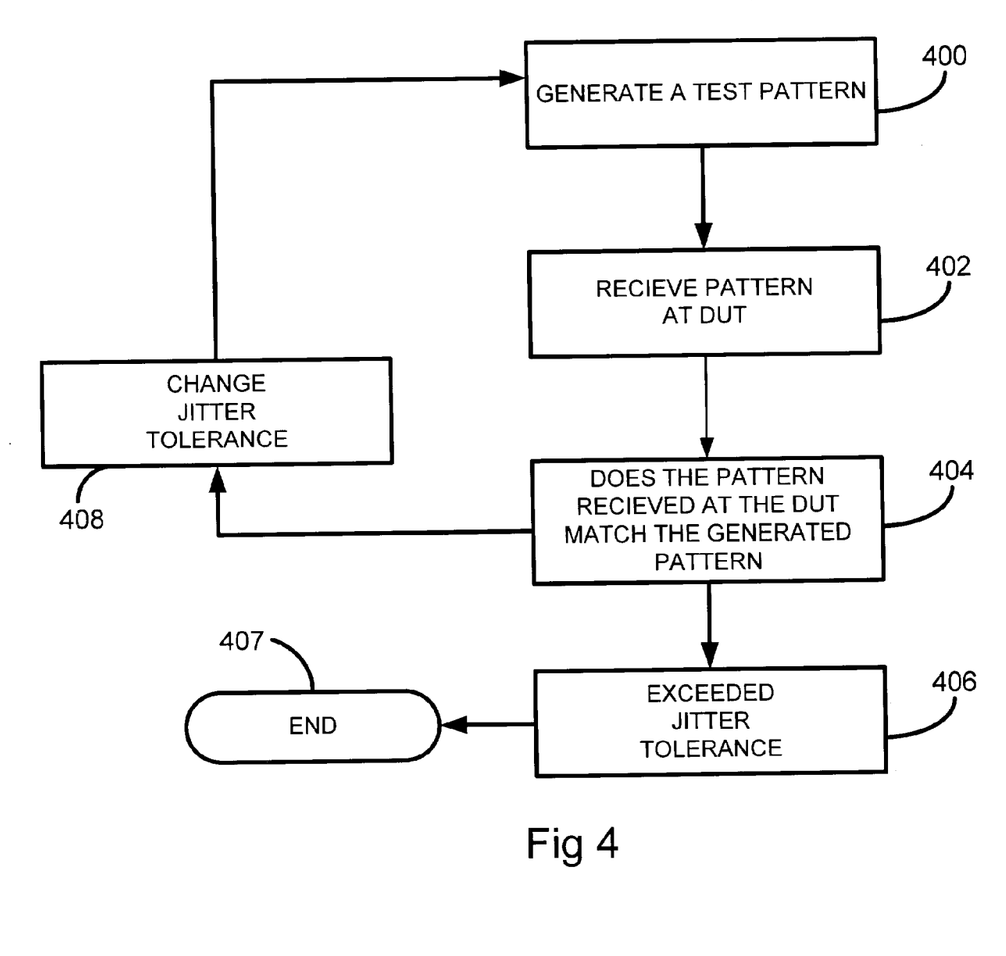
FIG. 4 displays a flowchart of the method of the present invention.

FIG. 4 displays a flowchart of a method of the present invention. In FIG. 4, the pattern generator generates a test pattern as shown at 400. The test pattern is a multiple of the frequency that the DUT is configured to receive. Therefore, if the DUT is configured to receive communication at 1×, the test pattern is generated at 2×, 3×, 4×, 5×, etc. The test pattern is then received at the DUT as shown at 402. Once the test pattern is received at the DUT, the test pattern is analyzed to determine if the test pattern received at the DUT matches the test pattern generated by the pattern generator. The test pattern is analyzed by a BERT tester. If the test pattern received at the DUT does not match the test pattern generated by the test pattern generator, the maximum tolerance of the DUT is exceeded as shown at 406. Once the maximum tolerance of the DUT is exceeded, the method ends as shown at 407. However, if the test pattern received at the DUT matches the test pattern generated by the test pattern generator, the jitter tolerance is changed as shown in 408. By incrementally changing the jitter tolerance, the jitter tolerance of the DUT may be accurately identified.

The test pattern may be changed in a number of different ways. For example, in one embodiment of the present invention, the amount of over sampling may be changed until there is a failure in the DUT. Therefore, the test pattern generator may generate a pattern at 1×, then 2×, then 3×, etc. In another embodiment of the present invention, the pattern generator may start generating patterns at a high over sampling rate, such as 8× or 9×, and work back down to 1×. In a third embodiment, the pattern generator may change the bit pattern for a specific sampling rate. For example, when using 2× over sampling for a bit pattern 1100 instead of sending 11110000, the pattern generator may send the value 11100000. Lastly, a combination of changing the over sampling rates and the bit patterns within the over sampling rates may be used to test for jitter tolerance.

Several alternate embodiments of the present invention are implemented. In one alternate embodiment of the present invention, a test pattern is generated at a non-integer multiple of a data rate of a receiver. The data rate is introduced and tested using a variety of methods. In a first method, base jitter is generated to test a DUT. The base jitter is introduced by generating a test pattern with a non-integer multiple of bits to represent selected bits in the data pattern. In a second method, induced jitter is implemented to test a DUT. The induced jitter is implemented by generating a test pattern that includes base jitter and then advancing/delaying transition times between test bits (i.e., data bits) in the test pattern.

Figure 5:
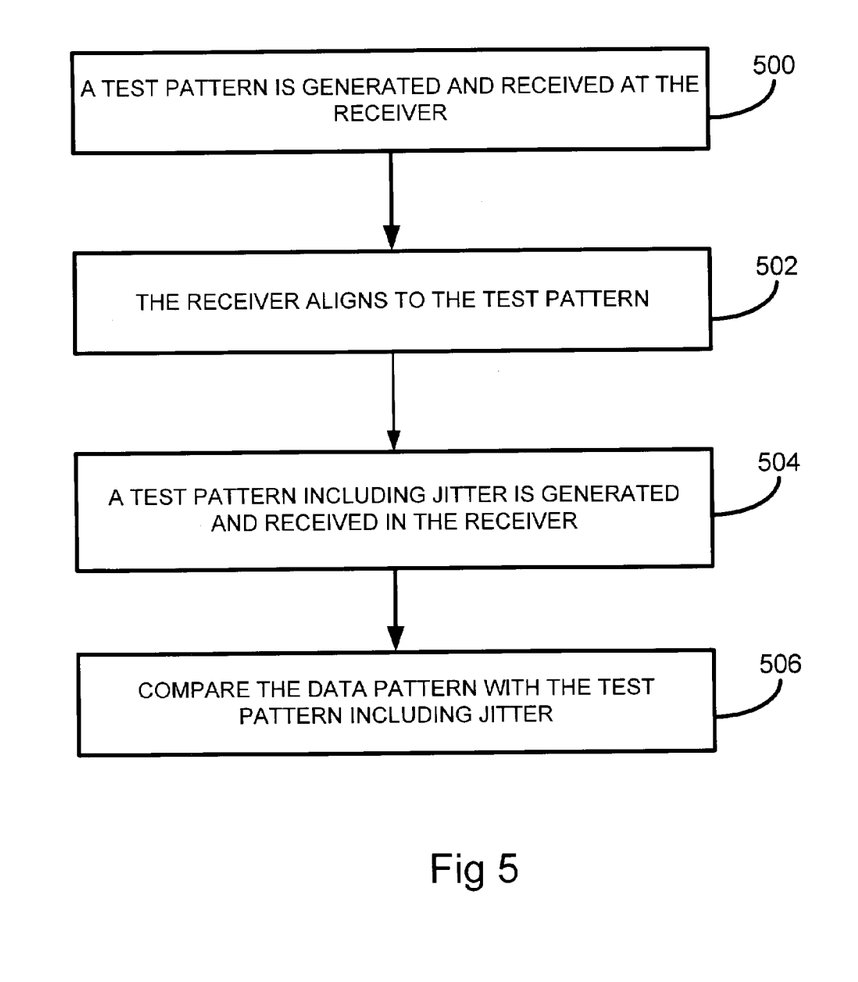
FIG. 5 displays a flow diagram detailing a method implemented in accordance with the teachings of the present invention.

FIG. 5 displays a flow diagram detailing a method implemented in accordance with the teachings of the present invention. A test pattern is generated by a tester and is received at a receiver. The receiver expects to receive a specific data pattern (i.e., expected data pattern), which was used to generate the test pattern. For example, a data pattern of 101 may be defined. Using the foregoing methodology, with 3× over sampling, a test pattern of 111000111 is generated and communicated to the receiver based on the initial data pattern of 101. Although the receiver receives a test pattern of 111000111, the receiver will interpret the test pattern as a data pattern of 101.

FIG. 5 will be discussed in conjunction with FIG. 1. At 500, a test pattern is generated and received at a receiver. For example, a test pattern is generated at 100 and received in a receiver (i.e., DUT 102). At step 502, the receiver (i.e., DUT 102), synchronizes with the beginning of the test pattern. In one embodiment of the present invention, the receiver (i.e., DUT 102) synchronizes or aligns with the test pattern to properly interpret bits as they are received in the receiver (i.e., DUT 102).

At step 504, a test pattern including jitter is generated and received in the receiver (i.e., DUT 102). The test pattern may be generated using either of the two foregoing methods (i.e., base jitter, induced jitter) or both of the foregoing methods in combination. At 506, the expected data pattern is compared with the test pattern including jitter to determine if there is a match. If the expected data pattern matches the test pattern, then the DUT 102 can support the jitter tolerance introduced in the test pattern. If the expected data pattern does not match the test pattern, then the DUT 102 has exceeded its jitter tolerance.

Figure 6:
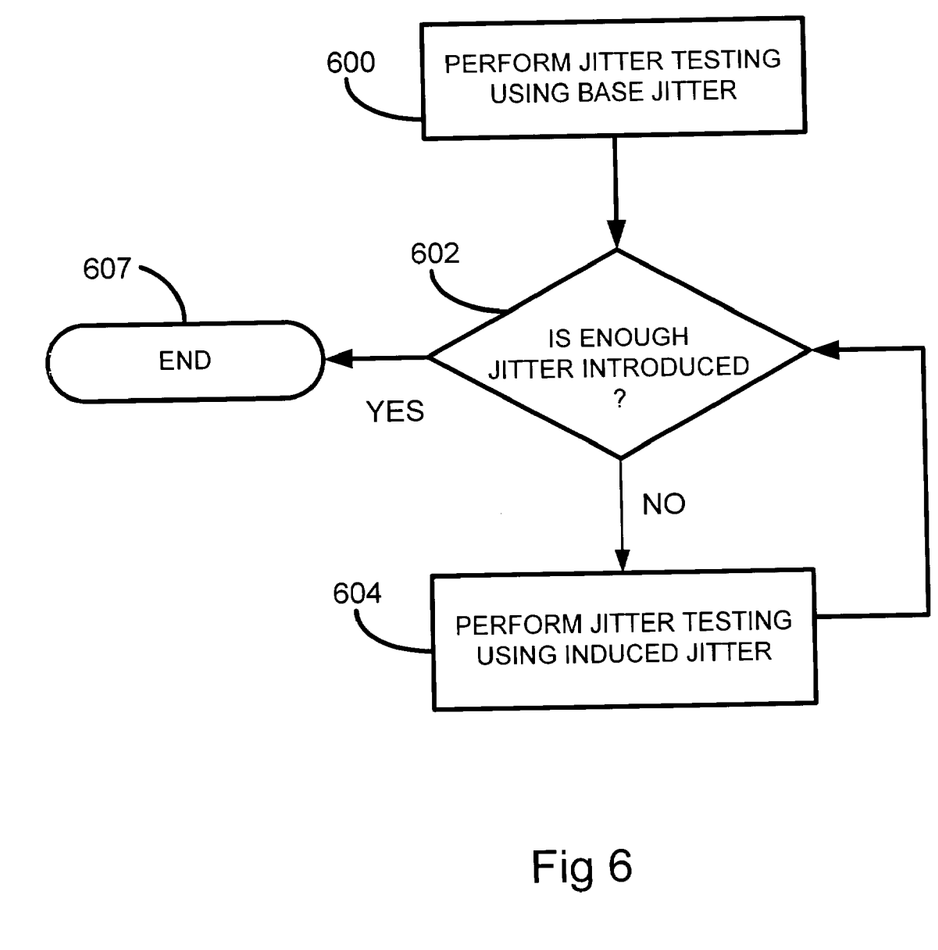
FIG. 6 displays a flowchart detailing a method of testing implemented in accordance with the teachings of the present invention.

FIG. 6 displays a flowchart detailing a method of testing implemented in accordance with the teachings of the present invention. In the method of FIG. 6, jitter testing is performed using base jitter as stated at 600. Analysis is performed as stated at 602 to determine if enough jitter (i.e., base jitter) was introduced to test the DUT at the required levels. If enough jitter was introduced to test the DUT at required levels, then the testing ends as stated at 607. If more testing is required, then jitter testing is performed using induced jitter as stated at 604. Analysis is then performed as stated at 602 to determine if enough jitter (i.e., induced jitter) was introduced to test the DUT at the required levels.

The method depicted by the flowchart of FIG. 6 uses a single test pattern. It should be appreciated that the use of one or more test patterns generated at a non-integer multiple data rate, generated at an integer multiple data rate, or any combination of the two may be implemented to determine the most accurate jitter tolerance of a receiver and is within the scope of the present invention. Further, test patterns generated at non-integer multiple data rates and test patterns generated at integer multiple data rates may be used in combination and are within the scope of the present invention. Lastly, any combination of the foregoing, including test patterns generated at integer multiple data rates, test patterns generated of non-integer multiple data rates, test patterns generated with several different non-integer multiple data rates and test patterns generated with different integer multiple data rates may be implemented in combination.

Using the method and apparatus of the present invention, a test pattern including base jitter is generated. The test pattern including base jitter includes a transition time that has an inherent and known displacement from a standard transition time determined by the data rate of a receiver. Each transition in the test pattern is then advanced or delayed by an additional known displacement (i.e., induced jitter).

In one embodiment of the present invention, the displacement times are determined by the following jitter equations, where for a given receiver operating at D and a test pattern of rate N, where N/D is simplified to a reduced fraction, the Base Jitter, One Bit Jitter, and Resolution are given by Eqns. (1), (2), and (3) given below:

$$\text{Base Jitter} = (D-1)/N \text{ UI} \qquad \text{Eqn. (1)}$$

$$\text{One Bit Jitter} = D/N \text{ UI} \qquad \text{Eqn. (2)}$$

$$\text{Resolution} = 1/N \text{ UI} \qquad \text{Eqn. (3)}$$

UI stands for unit interval. The Base Jitter (i.e., maximum inherent jitter) represents the inherent jitter of a test pattern. The One Bit Jitter (i.e., induced by changing one bit of the test pattern) represents the jitter added by changing bits in the test pattern. The Resolution (i.e., the increments of jitter attainable by the test pattern) represents the level of granularity that the jitter may be measured by.

An example of calculating jitter using the foregoing methodology is presented using Table III given below.

In Table III, a data word is represented by the bit pattern 1010001110. It should be appreciated that the data word represents the expected data pattern (i.e., the data pattern that the receiver expects to receive). The data word includes ten bits each identified by the number in the data bit row. For example, data bit 3 of the data word is a logical 1 and data bit 6 of the data word is a logical 0. In addition, each bit in the data word is replicated a number of times by a test bit in the test pattern presented in the third row of Table III.

Referring to Table III, it should be appreciated that the test bits representing the data bits are non-uniform and vary relative to each other. Therefore, a variable number of test bits may be used to implement each data bit. For example, the test bits associated with data bits 1, 2, 3, 4, 6, 7, 8, and 9 are implemented with three-test bits. However, the test bits associated with data bits 5 and 10 are implemented with four-test bits. In one embodiment of the present invention, the rate of the test pattern averages out to a rate expected by a receiver. Therefore, although the number of test bits representing each data bit may be non-uniform or varied, the overall rate of the test pattern averages out to a data rate that is anticipated by the receiver.

In one embodiment of the present invention, D is 5 and N is 16. Using Eqn. (1), Eqn. (2), and Eqn. (3), the Base Jitter is calculated to be 0.25 UI, the One Bit Jitter is calculated to be 0.3125 UI, and the Resolution is calculated to be 0.0625 UI. In one embodiment of the present invention, in order to maintain a test pattern with a total base jitter that averages to the receiver rate, the test pattern should include three-test bits per data bit of the data word with an additional two-test bits per ten data bits of the data word. In order to maintain a test pattern averaging the receiver rate, the two extra test bits should be incorporated into the test pattern every five data bits of the data word. Stated in another way, the test pattern should include sixteen-test bits for every five data bits of the data word. In the test pattern presented in Table III, the first four bits of the data word (i.e., 1010) are replicated three times (i.e., three-test bits) in the test pattern (i.e., 111000111000). The fifth bit in the data word (i.e., 0) is replicated four times (i.e., four-test bits) in the test pattern (i.e., 0000). Thus, as far as the receiver is concerned, the test pattern averages out to the correct data rate (i.e., 16-test bits for every five data bits of the data word).

Using Table III, data bits 1, 2, and 3 of the data word are each represented by three-test bits in the test pattern 111, 000, and 111, respectively. In addition, it should be appreciated that data bits 5 and 10 of the data word are each represented with four-test bits. Therefore, the amount of test bits used to represent each data bit in the data word may vary with the constraint that the overall number of test bits in the test pattern is consistent with the expected data rate of the receiver. For example, the test bits in the test pattern associated with data bits 1, 2, 3, 4, 6, 7, 8, and 9 of the data word are each implemented with three-test bits. However, data bits 5 and 10 of the data word are both represented by four-test bits. As a result, in a ten-bit data word, 32-test bits are communicated to the receiver. Stated differently, in one

TABLE III

| Data Word: | 1 | 0 | 1 | 0 | 0 | 0 | 1 | 1 | 1 | 0 |
|---|---|---|---|---|---|---|---|---|---|---|
| Data Bit: | 1 | 2 | 3 | 4 | 5 | 6 | 7 | 8 | 9 | 10 |
| Test Pattern: | 111 | 000 | 111 | 000 | 0000 | 000 | 111 | 111 | 111 | 0000 | embodiment of the present invention, the number of bits in the test pattern relative to the number of bits in the data pattern equals N/D.

The initial test pattern of Table III introduces base jitter. Since the receiver D is operating at a multiple of the test pattern rate N (i.e., N/D is a reduced fraction), base jitter is introduced with the first, second, third, and fourth data bits of the data word. Therefore, the test bits included in the test pattern associated with the first, second, third, and fourth data bits, which are 111, 000, 111, and 000, respectively, each add base jitter. In the case where the receiver is aligned to the first test bit of the test pattern, −1/N UI (i.e., the Resolution) of additive jitter is present for every three-test bits of the test pattern. The test bits associated with the fourth data bits of the data word (i.e., 0000) subtracts the jitter accumulated by the previous four sets of test bits and returns the test pattern to a no-jitter state. For example, the jitter accumulated using the test pattern associated with the first five data bits of the data word of Table III is presented in Table IV given below:

TABLE IV

| Data Bit: | 1 | 2 | 3 | 4 | 5 | 6 | 7 | 8 | 9 | 10 |
|---|---|---|---|---|---|---|---|---|---|---|
| Test Pattern: | 111 | 000 | 111 | 000 | 0000 | 000 | 111 | 111 | 111 | 0000 |
| Jitter (UI) | −1/N | −2/N | −3/N | −4/N | 0 | −1/N | −2/N | −3/N | −4/N | 0 |

Referring to Table IV, the test bits associated with data bits 1, 2, 3, and 4, each adds jitter. In Table IV, each set of three-test bits introduces −1/N UI jitter. In other words, each set of test bits associated with a data bit adds −1/N UI jitter. This jitter is additive so that at the end of data bit 1, there is −1/N UI jitter. At the end of data bit 2, there is −1/N+−1/N=−2/N UI jitter, etc.

In Table IV, the test bits (i.e., 111) associated with data bit 1 adds −1/N amount of jitter. The test bits (i.e., 000) associated with data bit 2 adds −1/N amount of jitter. The test bits (i.e., 111) associated with data bit 3 adds −1/N amount of jitter. The test bits (i.e., 000) associated with data bit 4 adds −1/N amount of jitter. From the foregoing example, in Table IV, the jitter increases until the maximum jitter of −4/N is achieved which is the base jitter. The test bits associated with data bit 5 are 0000. The additional test bit in the test bits associated with data bit 5 reduces the jitter to zero since the additional test bit brings the rate of the test pattern N to the rate of the receiver D. The same test pattern (i.e., test bits) is then replicated for data bits 6, 7, 8, and 9 as for the data bits 1, 2, 3, and 4. The test bits associated with data bit 10 (i.e., 0000) then reduces the jitter back to zero.

The converse of the foregoing may also be implemented. Table V given below provides an example.

TABLE V

| Data Bit: | 1 | 2 | 3 | 4 | 5 | 6 | 7 | 8 | 9 | 10 |
|---|---|---|---|---|---|---|---|---|---|---|
| Test Pattern: | 1111 | 0000 | 1111 | 0000 | 000 | 0000 | 1111 | 1111 | 1111 | 000 |
| Jitter (UI) | +1/N | +2/N | +3/N | +4/N | 0 | +1/N | +2/N | +3/N | +4/N | 0 |

The test patterns depicted in Table V include four sequences of four-test bits and then the fifth sequence of test bits (i.e., test bits associated with data bit 5) includes three-test bits. Using Table V given above, the test pattern associated with data bits 1, 2, 3, and 4 each include jitter. The jitter increases until the maximum jitter of +4/N is achieved which is the base jitter. The lack of a test bit (i.e., three bits) in the test bits associated with data bit 5 then reduces the jitter to zero since the lack of a test bit brings the rate of the test pattern N to the rate of the receiver D. The same thing is then replicated for data bits 6, 7, 8, and 9. The test pattern associated with data bit 10 (i.e., 000) then reduces the jitter back to zero.

In accordance with the methodology of the present invention depicted in FIG. 6, if more jitter is required, jitter testing is performed using induced jitter (i.e., 604 of FIG. 6). To add induced jitter, the transitions between test bits in a test pattern are advanced or delayed. The transitions between test bits in the test pattern are advanced or delayed by changing the test bit at a transition. For example, if a test bit at the edge of a transition is a logical 1, it may be changed to a logical 0. If a test bit at the edge of a transition is a logical 0, it may be changed to a logical 1. As depicted in Table VI given below, one negative input bit of jitter can be added to the first transition of the test pattern by inverting the third test bit in the test pattern.

TABLE VI

| Data Bit: | 1 | 2 | 3 | 4 | 5 | ... |
|---|---|---|---|---|---|---|
| Test Pattern: | 11 | 0000 | 111 | 000 | 0000 | ... |
| Jitter (UI): | −1/N−1/D | −2/N | −3/N | −4/N | 0 | ... |

Figure 7:
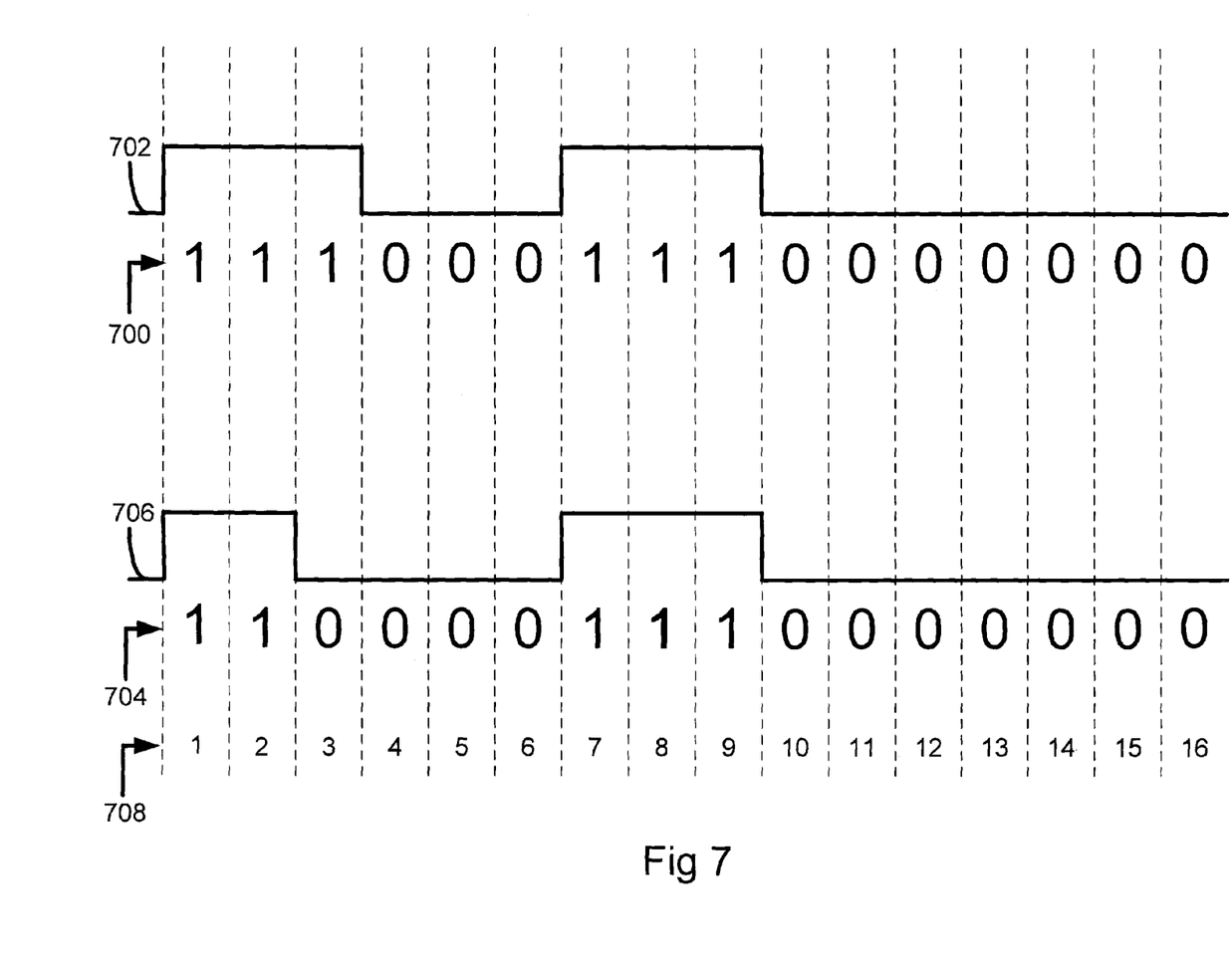
FIG. 7 displays a timing diagram implemented in accordance with the teachings of the present invention.

Comparing Table VI to Table III, the test bits associated with the first data bit in Table III are 111. The test bits associated with the first data bit in Table VI are 110. The third test bit in the test pattern (i.e., shown in Table III) is changed from a logical 1 to a logical 0 to produce the test pattern shown in Table VI. In Table VI, the third test bit in the test pattern is combined with the test bits associated with the second data bit of the data word (i.e., 0000). As a result, the first transition of the test pattern presented in Table VI is advanced relative to the first transition of the test pattern presented in Table FIG. 7 depicts a timing diagram implemented in accordance with the teachings of the present invention. A test pattern 700 associated with the first five data bits of the data word shown in Table I is depicted in FIG. 7. Waveform 702 is a graphical representation of the test pattern 700. A test pattern 704 associated with the first five data bits of the data word presented in Table VI is depicted in FIG. 7. Waveform 706 is a graphical representation of the test pattern 704. In addition, time periods 1 through 16 are shown as 708.

In FIG. 7, the first three-test bits of test pattern 700 (i.e., 111) fall within the first three time periods 708 (i.e., 1, 2, 3). Using the method of the present invention, induced jitter is introduced in the test pattern 700 by changing the third test bit (i.e., logical 1) of test pattern 700. Changing the third test bit (i.e., to a logical 0) in the test pattern 700 produces the test pattern 704. As shown in waveform 702, the first transition of test pattern 700 occurs between time periods (i.e., 708) three and four. However, after the third test bit of test pattern 700 is changed producing the test pattern 704, the first transition as shown in waveform 706 occurs between time periods (i.e., 708) two and three. The transition of waveform 706 occurs earlier than the transition of waveform 702 since the transition of waveform 702 occurs between time periods (i.e., 708) three and four and the transition of the waveform 706 occurs between time periods (i.e., 708) two and three. Consequently, switching the third test bit of test pattern 700 to produce the test pattern 704 advances the first transition and adds induced jitter to the test pattern 700.

The test pattern 700 is generated with base jitter. The test pattern 700 includes a transition time (i.e., first transition) that has an inherent and known displacement from a standard transition time determined by the data rate of a receiver. Each transition in the test pattern 700 is then advanced or delayed by an additional known displacement (i.e., induced jitter). Changing the third test bit in test pattern 700 to produce test pattern 704 advances the first transition of the test pattern 700 by an additional known displacement (i.e., induced jitter).

In an alternate embodiment of the present invention, as depicted in Table VII given below, one positive input bit of jitter can be added to the first transition in the test pattern by inverting the fourth test bit.

TABLE VII

| Data Bit: | 1 | 2 | 3 | 4 | 5 | ... |
|---|---|---|---|---|---|---|
| Test Pattern: | 1111 | 00 | 111 | 000 | 0000 | ... |
| Jitter (UI): | $-1/N+1/D$ | $-2/N$ | $-3/N$ | $-4/N$ | 0 | ... |

Comparing Table III and Table VII, the test bits associated with the first data bit in Table III are represented by test bits 111. The test bits associated with the second data bit of Table III are represented by test bits 000. Changing the third test bit in the test pattern presented in Table III (i.e., 000) results in the test pattern depicted in Table VII. In the test pattern depicted in Table VII, the fourth test bit in the test pattern is changed to a logical 1. In addition, the fourth test bit in the test pattern is grouped with the test bits associated with the first data bit (i.e., 1111). As a result, the first transition associated with the test pattern presented in Table VII is delayed relative to the first transition of the test pattern presented in Table III.

Figure 8:
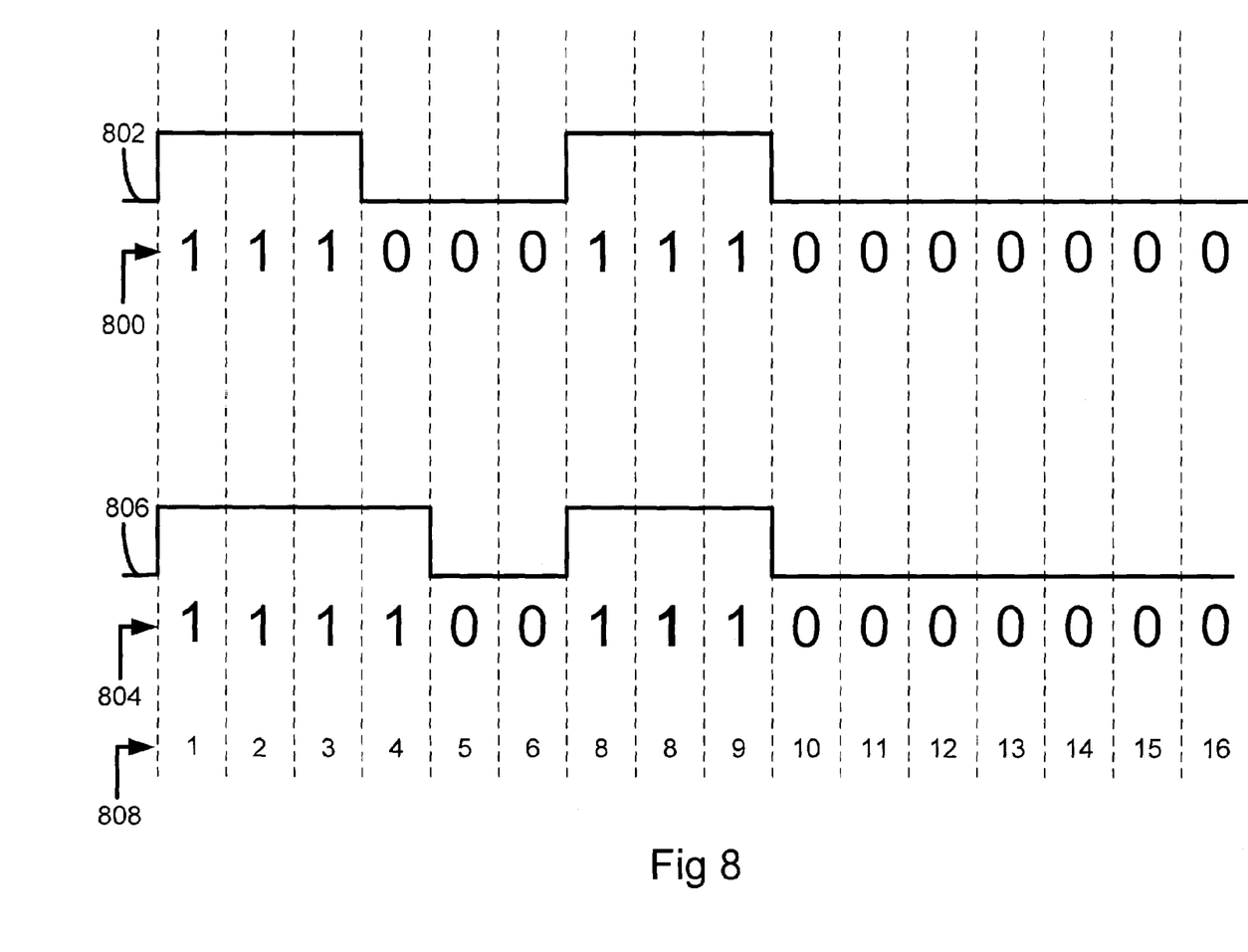
FIG. 8 displays a timing diagram implemented in accordance with the present invention.

FIG. 8 depicts a timing diagram implemented in accordance with the teachings of the present invention. FIG. 8 depicts a graphical representation of the method of the present invention. A test pattern 800 associated with the first five data bits of the data word presented in Table III is depicted in FIG. 8. Waveform 802 is a graphical representation of the test pattern 800. A test pattern 804 associated with the first five data bits of the data word presented in Table VII is depicted in FIG. 8. Waveform 806 is a graphical representation of the test pattern 804. In addition, time periods 1 through 16 are shown as 808.

In FIG. 8, the first three-test bits of test pattern 800 (i.e., 111) fall within the first three time periods 808 (i.e., 1, 2, 3). Using the method of the present invention, induced jitter is introduced in the test pattern 800 by changing the fourth test bit of test pattern 800. Changing the fourth test bit of test pattern 800 produces test pattern 804.

Waveform 802, which corresponds to test pattern 800, depicts the first transition of test pattern 800 as occurring between time periods (i.e., 808) three and four. However, after the fourth test bit of test pattern 800 is changed to produce test pattern 804 (i.e., 1111), the first transition occurs between time periods (i.e., 808) four and five as depicted by waveform 806. The transition of waveform 802 occurs earlier since the transition of waveform 802 occurs between time periods (i.e., 808) three and four and the transition of the waveform 806 occurs between time periods (i.e., 808) four and five. Consequently, switching the fourth test bit of test pattern 800 to produce test pattern 804 delays the transition and adds induced jitter.

Thus, the present invention has been described herein with reference to a particular embodiment for a particular application. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A method of testing comprising the steps of:
    generating a test pattern at a non-integer multiple of a data rate expected by a receiver; and
    testing the receiver for jitter in response to receiving the test pattern generated at the non-integer multiple of the data rate expected by the receiver.

2. A method of testing as set forth in claim 1, wherein the test pattern generated at the non-integer multiple of the data rate of the receiver includes base jitter.

3. A method of testing as set forth in claim 1, wherein the test pattern is generated at rate N and the data rate expected by the receiver is rate D, where N/D is a reduced fraction.

4. A method of testing as set forth in claim 1, wherein the test pattern is generated at rate N and the data rate expected by the receiver is rate D, where N is a non-integer multiple of D.

5. A method of testing as set forth in claim 1, wherein the test pattern is generated at rate N and includes X bits and the data rate expected by the receiver is generated at rate D and includes Y bits, where X/Y is equivalent to N/D.

6. A method of testing as set forth in claim 1, wherein the test pattern is of rate N and the data rate expected by the receiver is rate D and the base jitter is equivalent to (D−1)/N.

7. A method of testing as set forth in claim 1, where the test pattern is of rate N and the data rate expected by the receiver is rate D and resolution is equivalent to 1/N.

8. A method of testing as set forth in claim 1, further comprising the steps of generating a test pattern including induced jitter by adjusting the test pattern generated at the non-integer multiple of the data rate expected by a receiver.

9. A method of testing as set forth in claim 8, wherein the test pattern including induced jitter is of rate N and the receiver operates at rate D, and one bit jitter is equivalent to D/N.

10. A method of testing comprising the steps of:
    generating a data pattern;
    testing a receiver with a first test pattern including base jitter, wherein the first test pattern including base jitter is generated in response to the data pattern; and
    testing the receiver with a second test pattern including induced jitter, wherein the second test pattern including induced jitter is generated in response to the first test pattern.

11. A method of testing as set forth in claim 10, wherein the first test pattern including base jitter comprises a varying number of bits representing each bit in the data pattern.

12. A method of testing as set forth in claim 10, wherein the second test pattern including induced jitter comprises a varying number of bits representing each bit in the data pattern.

13. A method of testing as set forth in claim 10, wherein the first test pattern including base jitter further comprises a varying number of bits representing each bit in the data pattern and a rate, wherein the rate averages to a rate expected by the receiver.

14. A method of testing jitter comprising the steps of:
generating a first bit pattern, wherein the first bit pattern is generated at a multiple of a communication speed of a receiver;
generating a second bit pattern by adjusting the first bit pattern;
communicating the second bit pattern;
generating a third bit pattern by receiving bits in the receiver in response to communicating the second bit pattern; and
testing the third bit pattern for jitter.

15. A method of testing jitter as set forth in claim 14, wherein the multiple of the communication speed of the receiver is a non-integer multiple.

16. A method of testing jitter as set forth in claim 14, wherein the second bit pattern includes a plurality of second bit patterns and at least one of the plurality of the second bit patterns are generated at a non-integer multiple date rate.

17. A method of testing jitter as set forth in claim 14, wherein the second bit pattern includes a plurality of second bit patterns, at least one of the plurality of the second bit patterns are generated at an integer multiple data rate.

18. A method of testing jitter as set forth in claim 14, wherein the step of generating a second bit pattern by adjusting the first bit pattern comprises the step of changing at least one bit in the first bit pattern.

19. A method of testing jitter as set forth in claim 14, wherein the step of generating a second bit pattern by adjusting the first bit pattern comprises the step of advancing a transition associated with the first bit pattern.

20. A method of testing jitter as set forth in claim 14, wherein the step of generating a second bit pattern by adjusting the first bit pattern comprises the step of delaying a transition associated with the first bit pattern.

* * * * *